(12) United States Patent
Tochigi et al.

(10) Patent No.: US 11,287,192 B2
(45) Date of Patent: Mar. 29, 2022

(54) HEAT SINK

(71) Applicant: Furukawa Electric Co., Ltd., Tokyo (JP)

(72) Inventors: Yasuyuki Tochigi, Tokyo (JP); Hung Wei Tseng, Taipei (TW); Kuang Yu Chu, Taipei (TW); Masahiro Meguro, Tokyo (JP); Kenya Kawabata, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/766,793

(22) PCT Filed: Oct. 4, 2016

(86) PCT No.: PCT/JP2016/079420
§ 371 (c)(1),
(2) Date: Apr. 6, 2018

(87) PCT Pub. No.: WO2017/061408
PCT Pub. Date: Apr. 13, 2017

(65) Prior Publication Data
US 2018/0283797 A1    Oct. 4, 2018

(30) Foreign Application Priority Data
Oct. 8, 2015   (JP) .............................. JP2015-200460

(51) Int. Cl.
*F28D 15/02* (2006.01)
*H01L 23/427* (2006.01)
(Continued)

(52) U.S. Cl.
CPC ..... *F28D 15/0233* (2013.01); *F28D 15/0275* (2013.01); *F28F 1/045* (2013.01);
(Continued)

(58) Field of Classification Search
CPC ............. F28D 15/0233; F28D 15/0275; F28D 2015/0216; F28F 1/045; F28F 3/02; H01L 23/427; H01L 23/3672; H05K 7/2039
(Continued)

(56) References Cited

U.S. PATENT DOCUMENTS 5,527,588 A  *  6/1996  Camarda et al. ......... B32B 3/20
                                                     428/188
7,609,521 B2 * 10/2009  Wu ..................... F28D 15/0275
                                                     165/104.33
(Continued)

FOREIGN PATENT DOCUMENTS

| JP | S5780748 A  | 5/1982 |
| JP | S58154378 U | 10/1983 |

(Continued)

OTHER PUBLICATIONS

English Translation of Notification to Grant Utility model Patent Right dated Aug. 10, 2018 for Chinese Utility Model Application No. 201690001142.2.
(Continued)

*Primary Examiner* — Tho V Duong
*Assistant Examiner* — Raheena R Malik
(74) *Attorney, Agent, or Firm* — Dorsey & Whitney LLP

(57) ABSTRACT

Provided is a heat sink having excellent heat dissipation efficiency by having excellent thermal diffusion characteristics in a planar direction of a heat receiving plate. The heat sink has the heat receiving plate that is thermally connected to a heating element, heat pipes that are thermally connected to the heat receiving plate and are formed from a tube body, and heat dissipation fins that are thermally connected to the heat receiving plate, wherein the heat pipes are provided in a plurality of layers in a vertical direction to a surface of the
(Continued)

heat receiving plate, and in at least two layers of the plurality of layers, positions of the heat pipes on the surface of the heat receiving plate are not identical to each other.

4 Claims, 6 Drawing Sheets

(51) Int. Cl.
*F28F 1/04* (2006.01)
*F28F 3/02* (2006.01)
*H01L 23/367* (2006.01)
*H05K 7/20* (2006.01)

(52) U.S. Cl.
CPC .............. *F28F 3/02* (2013.01); *H01L 23/427* (2013.01); *F28D 2015/0216* (2013.01); *H01L 23/3672* (2013.01); *H05K 7/2039* (2013.01)

(58) Field of Classification Search
USPC ............... 257/E23.088; 165/104.33; 361/700
See application file for complete search history.

(56) References Cited

U.S. PATENT DOCUMENTS

| | | | | |
|---|---|---|---|---|
| 7,694,718 | B2* | 4/2010 | Lai et al. | H01L 23/427 165/104.21 |
| 7,866,376 | B2* | 1/2011 | Jiang | H01L 23/467 165/104.33 |
| 9,593,887 | B2* | 3/2017 | Yeh | F28D 15/0275 |
| 2006/0011329 | A1* | 1/2006 | Wang et al. | F28D 15/0233 165/104.33 |
| 2006/0032617 | A1* | 2/2006 | Chen | F28F 3/02 165/104.33 |
| 2007/0012428 | A1* | 1/2007 | Wu | F28D 15/0275 165/104.33 |
| 2007/0074857 | A1* | 4/2007 | Xia | H01L 23/427 165/104.33 |
| 2007/0215321 | A1* | 9/2007 | Yang | H01L 23/4006 165/80.3 |
| 2008/0173430 | A1* | 7/2008 | Jin et al. | F28D 15/0233 165/104.33 |
| 2009/0107653 | A1* | 4/2009 | Jiang | H01L 23/467 165/80.3 |
| 2009/0109621 | A1* | 4/2009 | Cheng | F28D 15/0233 361/697 |
| 2009/0236076 | A1* | 9/2009 | Min | H01L 23/467 165/80.3 |
| 2009/0260782 | A1* | 10/2009 | Whitney | B21D 53/02 165/104.21 |
| 2010/0126700 | A1* | 5/2010 | Chen | F28D 15/0233 165/104.26 |
| 2010/0128436 | A1* | 5/2010 | Edmunds | H01L 23/427 361/700 |
| 2011/0209864 | A1* | 9/2011 | Figus | F28F 9/26 165/287 |
| 2012/0069521 | A1* | 3/2012 | Hwang | F28D 15/0233 361/697 |
| 2014/0202666 | A1* | 7/2014 | Cheng | F28D 15/0275 165/104.26 |
| 2016/0209121 | A1* | 7/2016 | Yeh | F28D 15/0233 |
| 2017/0023306 | A1* | 1/2017 | Stavi | F28D 15/0233 |

FOREIGN PATENT DOCUMENTS

| | | |
|---|---|---|
| JP | H08105698 A | 4/1996 |
| JP | 1038483 A | 2/1998 |
| JP | 2004311718 A | 11/2004 |
| TW | M254658 U | 1/2005 |

OTHER PUBLICATIONS

Decision to Grant dated Nov. 29, 2017 for Taiwanese Application No. 105132167.
International Search Report and Written Opinion dated Dec. 20, 2016 for PCT Application No. PCT/JP2016/079420.
Taiwanese Office Action dated Jun. 30, 2017 for Taiwanese Application No. 105132167.
English Translation of International Preliminary Report on Patentability Chapter I dated Apr. 10, 2018 for PCT Application No. PCT/JP2016/079420.
English Translation of the Written Opinion of the International Search Authority dated Dec. 20, 2016 for PCT Application No. PCT/JP2016/079420.
English translation of Decision of Refusal received in JP Application No. 2017-544499 dated Oct. 7, 2019.
English Translation of Notification of Reasons for Refusal dated Jun. 3, 2019 received in JP Application No. 2017-544499.
English translation of Decision to Grant for JP Application No. 2017-544499, dated Feb. 12, 2020.

* cited by examiner

HEAT SINK

CROSS-REFERENCE TO RELATED APPLICATIONS

This application is a U.S. National Stage filing under 35 U.S.C. § 371 of PCT Application No. PCT/JP2016/079420, filed Oct. 4, 2016, which claims priority to Japanese Application No JP 2015/200460 filed Oct. 8, 2015, which applications are incorporated herein by reference, in their entirety, for any purpose.

TECHNICAL FIELD

The present disclosure relates to a heat sink for cooling a heating element, and particularly relates to a heat sink for cooling electronic parts mounted on mobile bodies such as railroad vehicles, aircraft, automobiles or the like and electronic devices.

BACKGROUND ART

As a conventional heat sink, a heat sink is widely used which includes a heat receiving plate, heat pipes of a tube body which are thermally connected to the heat receiving plate and extend for a predetermined length in the surface direction of the heat receiving plate, and heat dissipation fins erected on the heat pipes.

However, the heat sink above is in an aspect in which heat pipes are arranged in a single layer in a vertical direction to a surface of the heat receiving plate. In an aspect in which heat pipes are provided in a single layer, due to constraints on the bending of the heat pipes, constraints on the number of the heat pipes that can be arranged on a heat source and the like, thermal diffusion on the surface of the heat receiving plate may be insufficient. Therefore, in the above-mentioned heat sink, the heat dissipation fins erected on the surface of the heat receiving plate may not sufficiently contribute to heat dissipation in its entirety, as a result, there is a problem such that it is impossible to improve heat dissipation efficiency of the heat dissipation fins.

Having plate heat pipes, comprising meandering thin tunnel heat pipes in which heat transport by sensible heat of working fluid (heat transport by vibration and/or circulation of working fluid) is main principle of heat transport, as the first constituent element, and heat pipes, comprising non-meandering thin tunnel heat pipe in which heat transport by latent heat of working fluid (heat transport by evaporation and condensation during vapor movement of working fluid) is main principle of heat transport, as a second constituent element, a composite plate heat pipe has been proposed which has a basic configuration in which both constituent elements are combined and integrated (Japanese Laid-Open Patent Publication No. 10-38483).

However, in Japanese Laid-Open Patent Publication No. 10-38483 using the meandering thin tunnel heat pipes, since the heat pipes are provided by forming continuous flow paths rather than tube bodies and the heat pipes operate only in the vicinity just above a heating element, not all of the heat pipes stretched over a plate function. Therefore, also in Japanese Laid-Open Patent Publication No. 10-38483, thermal diffusion in a surface of the composite plate heat pipe may be still insufficient. In addition, since the composite plate heat pipe of Japanese Laid-Open Patent Publication No. 10-38483 is not an aspect in which heat dissipation fins are provided, sufficient cooling capability cannot be obtained. From the above, the composite plate heat pipe of Japanese Laid Open Patent Publication No. 10-38483 still has a problem that heat dissipation efficiency cannot be sufficiently improved.

DOCUMENT LIST

Patent Document

Patent Document 1: Japanese Laid-Open Patent Publication No. 10-38483

SUMMARY OF INVENTION

Technical Problem

The present disclosure is related to providing a heat sink with excellent heat dissipation efficiency by having excellent thermal diffusion characteristics in a planar direction of a heat receiving plate.

Solution to Problem

According to an aspect of the present disclosure, a heat sink includes: a heat receiving plate thermally connected to a heating element; heat pipes formed of a tube body thermally connected to the heat receiving plate; and heat dissipation fins thermally connected to the heat receiving plate, wherein the heat pipes are provided in a plurality of layers in a vertical direction to a surface of the heat receiving plate and in at least two layers of the plurality of layers, positions of the heat pipes on the surface of the heat receiving plate are not identical to each other.

In the above-mentioned aspect the heat pipes are laminated in two or more layers in the vertical direction to the surface of the heat receiving plate. With respect to at least two layers of the laminated heat pipes, the heat pipes are thermally connected to the heat receiving plate so that the positional relationship of the heat pipes on the surface of the heat receiving plate, that is, the positional relationship of the heat pipes in plan view does not become identical to each other. Therefore, with respect to the at least two layers, there are portions in which the laminated heat pipes do not overlap in plan view.

According to an aspect of the present disclosure, a heat sink where a heat conductor provided around the heat pipes.

According to an aspect of the present disclosure, a heat sink where the heat pipes have a flat shape.

According to an aspect of the present disclosure, a heat sink where the shape of the heat pipes is U-shaped, linear, L-shaped, S-shaped, or channel-shaped.

According to an aspect of the present disclosure, a heat sink where at least a portion of the heat pipes is arranged at the same position as the heating element in plan view.

Effects of Invention

According to an aspect of the present disclosure, tubular-heat pipes are provided in a plurality of layers in the vertical direction to the surface of the heat receiving plate. Since with respect to at least two of these layers, the positions of the heat pipes on the surface of the heat receiving plate are not identical to each other, the heat sink has excellent thermal diffusion characteristics in the planar direction of the heat receiving plate of the heat sink, that is, in a parallel direction to the surface of the heat receiving plate of the heat sink, so that the whole in the planar direction of the heat receiving plate is heat equalized. Since the heat sink as the whole in the planar direction of the heat receiving plate is heat equalized, heat dissipation efficiency of the heat dissipation fins thermally connected to the heat receiving plate is improved and consequently cooling performance of the heat sink with the heat pipes formed from the tube body is improved.

According to an aspect of the present disclosure, since the heat conductor is provided around the heat pipes, thermal diffusion characteristics of the heat sink in the parallel direction to the surface of the heat receiving plate is further increased, as a result, heat dissipation efficiency of the heat dissipation fins is further improved.

According to an aspect of the present disclosure, since the shape of the heat pipe is flat, in an aspect in which a contact area between the heat pipe and another member is large, it possible to thermally connect the heat pipe and other member. Therefore, since heat transfer from the heat receiving plate to the heat dissipation fins can be smoothened and thermal resistance can also be reduced, heat dissipation efficiency of the heat dissipation fins is further improved. In addition, since the shape of the heat pipe is flat, even when the heat pipes are provided in a plurality of layers, an increase in dimension in the vertical direction to the surface of the heat receiving plate can be prevented.

DESCRIPTION OF THE EMBODIMENTS

Figure 1:
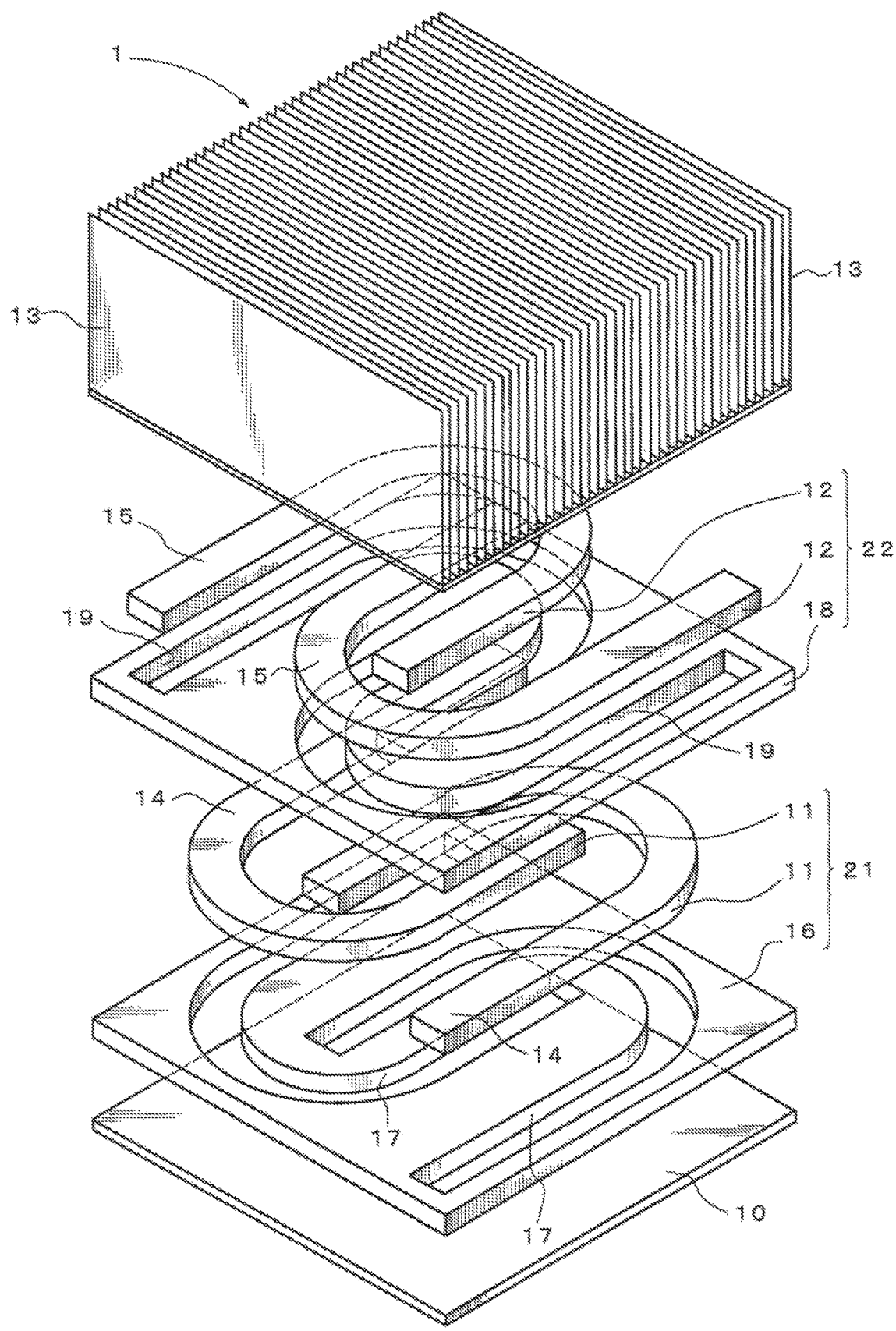
FIG. 1 is an exploded perspective view of a heat sink according to a first embodiment of the present disclosure.

A heat sink according to a first embodiment of the present disclosure will be described below with reference to the drawings. As shown in FIG. 1, a heat sink 1 according to the first embodiment includes a flat plate-like heat receiving plate 10 thermally connected to a heating element (not shown) on a heat receiving side surface, first heat pipes 11 thermally connected to the heat receiving plate 10 in a state of being in contact with the heat receiving plate 10 on a surface opposite to a heat receiving side of the heat receiving plate 10, second heat pipes 12 thermally connected to the first heat pipe 11 in a state of being in contact with the first heat pipe 11 on the surface opposite to the heat receiving side of the heat receiving plate 10, and heat dissipation fins 13 thermally connected to the second heat pipes 12 in a state of being in contact with the second heat pipes 12 on the surface opposite to the heat receiving side of the heat receiving plate 10.

In the heat sink 1, the flat plate-like heat receiving plate 10 is thermally connected to the heating element (not shown), therein acting as a heat receiving part of the heat sink 1.

The first heat pipe 11 includes a container 14 made of a tube body and working fluid is enclosed in the container 14. A shape of the first heat pipe 11 in plan view, that is, a shape in the parallel direction to a surface to the heat receiving plate 10 is U-shaped. Therefore, the first heat pipe 11 has two straight parts opposed to each other and a curved part between the two straight parts. Further, the first heat pipe 11 has the container 14 processed into a flat shape.

U-shaped portions are mounted and attached on the surface opposite to the heat receiving side of the heat receiving plate 10, that is, on a surface of a side of the heat dissipation fins 13, thereby, the first heat pipes 11 are thermally connected to the heat receiving plate 10. Therefore, the U-shaped portions of the first heat pipes 11 are in contact with the surface of the heat receiving plate 10.

The heat receiving plate 10 receiving heat from the heating element transfers heat to the first heat pipes 11 thermally connected to the heat receiving plate 10. In the first heat pipes 11 to which heat is transferred from the heat receiving plate 10, portions receiving heat of the U-shaped portions act as heat absorbing parts and portion not receiving heat of the U-shaped portions act as heat dissipation parts. Heat transporting along the shape of the first heat pipe 11 in plan view from the heat absorbing parts to the heat dissipation parts of the first heat pipe 11 transports heat in a planar direction of the heat receiving plate 10 in the heat sink 1, as a result, diffuses heat in the planar direction of the heat receiving plate 10 in the heat sink 1 along the shape of the first heat pipe 11 in plan view.

The installation number of the first heat pipes 11 is not particularly limited, but, in the heat sink 1 a plurality (two in FIG. 1) are provided. The arrangement relationship of the plurality of the first heat pipes 11 is not particularly limited, but in FIG. 1, one tip of the straight parts of one of the first heat pipes 11 is arranged so as to be opposed to a curved part of the other first heat pipe 11 in a U-shaped inner area. Further, a position of the first heat pipes 11 on the surface of the heat receiving plate 10 is not particularly limited, from the viewpoint of heat dissipation efficiency, it is preferable that at least a portion of the first heat pipes 11 is arranged at the same position as the heating element not shown in plan view.

Further, in the heat sink 1, a first heat conductor 16 is providing around each first heat pipe 11, thereby a fist heat pipe layer 21 is formed. The first heat conductor 16 is a plate-like body, and the surface thereof is arranged in a parallel direction to the surface of the heat receiving plate 10. In addition, the first heat pipes 11 and first heat conductor 16 in the first heat pipe layer 21 are thermally connected. Therefore, due to heat transport operation of the first heat pipe 11 heat-transferred from the heat receiving plate and heat transfer action of the first heat conductor 16, heat is more smoothly diffused in a planar direction of the first heat conductor 16 (that is, in the planar direction of the heat receiving plate 10 in the heat sink 1). Further, heat diffused in the planar direction of the first heat conductor 16 is transferred mainly from the first heat conductor 16 to the second heat pipes 12 of the first heat pipe layer 21.

In the heat sink 1, hole parts 17 having a shape and dimensions corresponding to a shape and dimensions of the first heat pipe 11 in plan view are provided in the first heat conductor 16 in the installation number of the first heat pipes 11. Therefore, by fitting the first heat pipes 11 into the hole parts 17 of the first heat conductor 16, it is in an aspect in which the first heat conductor 16 is provided around each of the first heat pipes 11. Therefore, in the heat sink 1, in an aspect in which the first heat conductor 16 is provided around the first heat pipes 11, the first heat pipe layer 21 to which the first heat pipes 11 and the first heat conductor 16 are thermally connected is formed.

As shown in FIG. 1, in the heat sink 1, further, on a surface on the side of the heat dissipation fins 13 of the heat receiving plate 10, in a state of being in contact with the first heat conductor 16, second heat pipes 12 thermally connected to the first heat conductor 16 are provided. Therefore, the second heat pipes 12 are thermally connected to the heat receiving plate 10 mainly via the first heat conductor 16 of the first heat pipe layer 21.

Further, in the heat sink 1, the second heat pipes 12 constitute a second heat pipe layer 22. The heat pipes are provided in a plurality of layers (two layers in FIG. 1) by laminating the second heat pipe layer 22 on the first heat pipe layer 21 in a vertical direction to the surface of the heat receiving plate 10.

Like the first heat pipe 11, the second heat pipe 12 has a container 15 made of a tube body and working fluid is enclosed in the container 15. A shape of the second heat pipe 12 in plan view, that is, a shape in the parallel direction to the surface of the heat receiving plate 10 is U-shaped like the first heat pipe 11. Therefore, the second heat pipe 12 also has the two straight parts opposed to each other and a curved part between the two straight parts. Further, the second heat pipe 12 also has the container 15 processed into a flat shape. That is, in the heat sink 1, the second heat pipe 12 is the same as the first heat pipe 11 from the viewpoint of reducing the number of parts.

U-shaped portions of the second heat pipes 12 are mounted on and attached to the first heat pipe layer 21, so that the second heat pipes 12 are thermally connected mainly to the first heat conductor 10 of the first heat pipe layer 21, consequently are thermally connected to the heat receiving plate 10 via the first heat pipe layer 21. Therefore, the U-shaped portions of the second heat pipes 12 are in contact with the first heat pipe layer 21.

In addition, positions of the second heat pipes 12 on the surface of the heat receiving plate 10, that is, in plan view are arranged not to be identical to the positions of the first heat pipes 11. In other words, the U-shaped portions of the second heat pipes 12 are arranged so as not to coincide with the U-shaped portions of the first heat pipes 11 in plan view. Therefore, the U-shaped portions of the second heat pipes 12 include parts overlapping with the U-shaped portions of the first heat pipes 11 in plan view and parts overlapping with the first heat conductor 16 (that is, parts not overlapping the U-shaped portions of the first heat pipes 11).

The first heat pipes 11 receiving heat from the heat receiving plate 10 transfer heat to the second heat pipes 12 mainly via the first heat conductor 16 provided around the first heat pipes 11 and thermally connected. In the second heat pipes 12 transferred heat from the first heat pipes 11 via the first heat conductor 16, portions of the U-shaped portions that receive heat act as heat absorbing parts, and portions of the U-shaped portions that do not receive heat act as heat dissipation parts. The second heat pipes 12 transport heat in the planar direction the heat receiving plate 10 in the heat sink 1 by transporting heat from the heat absorbing parts to the heat dissipation parts along an arrangement of the second heat pipes 12 in plan view which is different from an arrangement of the first heat pipes 11 in plan view. As a result, heat is diffused in the planar direction of the heat receiving plate 10 in the heat sink 1 along the arrangement of the second heat pipes 12 in plan view which is different from the arrangement of the first heat pipes 11 in plan view.

As above, in the heat sink 1, the first heat pipes 11 and the second heat pipes 12 transport heat in different directions in plan view, so that the whole in the planar direction of the heat receiving plate 10 in the heat sink 1 is heat equalized.

The installation cumber of the second heat pipes 12 is not particularly limited, but, in the heat sink 1, a plurality (two in FIG. 1) are provided. Further, the arrangement relationship between the plurality of second heat pipes 12 is not particularly limited, but in FIG. 1, one tip of the straight parts of one of the second heat pipes 12 is arranged to be opposed to the curved part of the other second heat pipe 12 in a U-shaped inner area. Further, as described above, as long as the U-shaped portions of the second heat pipes 12 are arranged so as not to coincide with the U-shaped portions of the first heat pipes 11 in plan view, the positions of the second heat pipes 12 are not particularly limited, but in FIG. 1, an arrangement of the second heat pipes 12 of the second heat pipe layer 22 is in an aspect in which an arrangement of the first heat pipes 11 of the first heat pipe layer 21 is reversed.

Further, the positions of the second heat pipes 12 on the surface of the heat receiving plate 10 is not particularly limited, but from the viewpoint of heat dissipation efficiency, it is preferable that at least a portion of the second heat pipes 12 is arranged at the same position as the heating element not shown in plan view.

Furthermore, the second heat pipe layer 22 of the heat sink 1 has a second heat conductor 18 around each second heat pipe 12. The second heat conductor 18 is a plate-like body, and the surface thereof is arranged in the parallel direction to the surface of the heat receiving plate 10. Further, the second heat pipes 12 and the second heat conductor 18 are thermally connected. Therefore, heat transport operation of the second heat pipes 12 and heat transfer action of the second heat conductor 18 diffuse heat more smoothly in the planar direction of the second heat conductor 18 (that is, in the planar direction of the heat receiving plate 10 in the heat sink 1). Furthermore, heat-diffused in the planar direction of the second heat conductor 18 is transferred mainly from the second heat conductor 18 to the heat dissipation fins 13 in the second heat pipe layer 22.

In the heat sink 1, hole parts 19 having a shape and dimensions corresponding to a shape and dimensions of the second heat pipe 12 in plan view are provided in the second heat conductor 18 in the installation number of the second heat pipes 12. Therefore, it is in an aspect in which by fitting the second heat pipes 12 into the hole parts 19 of the second heat conductor 18, a second heat conductor 18 is provided around each of the second heat pipes 12. Therefore, in the heat sink 1, in an aspect in which the second heat conductor 18 is provided around the second heat pipes 12, the second heat pipe layer 12 in which the second heat pipes 12 and the second heat conductor 18 are thermally connected is formed.

An attaching method of the first heat pipe layer 21 and the second heat pipe layer 22, not particularly limited, includes, for example, a method in which the first heat pipe layer 21 and the second heat pipe layer 22 are stacked on the surface of the heat receiving plate 10, and the first heat conductor 16 and the second heat conductor 18 are soldered to the heat receiving plate 10, or the like.

As shown in FIG. 1, in the heat sink 1, a plurality of flat plate-like heat dissipation fins 13 are erected on a surface of the second heat pipe layer 22 in a state in which the heat dissipation fins 13 directly or indirectly contact the second heat pipes 12 and the second heat conductor 18 in the second heat pipe layer 22 (in FIG. 1, in a state in which the heat dissipation fins 13 indirectly contact the second heat pipes 12 and the second heat conductor 18 via the plate-like body). Therefore, the heat dissipation fins 13 are thermally connected mainly to the second heat conductor 18, and are thermally connected to the heat receiving plate 10 mainly via the second heat conductor 18 of the second heat pipe layer 22 and the first heat conductor 16 of the first heat pipe layer 21. A fin pitch of the heat dissipation fins 13 is not particularly limited, and may be at equal intervals or mat not be at equal intervals. In the heat sink 1 the heat dissipation fins 13 are arranged in the parallel direction to the surface of the heat receiving plate 10, that is, are arranged at equal intervals in the parallel direction to the surface of the second heat pipe layer 22. Further, in the heat sink 1, any of the heat dissipation fins 13 is erected such that its surface is vertical to the surface of the heat receiving plate 10, that is, is vertical to the surface of the second heat pipe layer 22.

The method for attaching the heat dissipation fins 13 to the surface of the second heat pipe layer 22 is not particularly limited, for example, includes a method of joining an end part of the heat dissipation fins 13 to the surface of the second heat pipe layer 22 by soldering or the like, a method of fitting into recessed grooves formed on a surface of the second heat conductor 18, or the like.

The heat receiving plate 10, the first heat conductor 16, the second heat conductor 18, and the heat dissipation fins 13 are all materials having good thermal conductivity, are made of, for example, aluminum, an aluminum alloy, copper, a copper alloy, or the like. Further, materials of the container 14 of the first heat pipe 11 and the container 15 of the second heat pipe 12 are also made of the same metallic material as the heat recessing plate 10, the first heat conductor 16, the second heat conductor 18, and the heat dissipation fins 13.

As working fluid for the first heat pipe 11 and the second heat pipe 12, working fluid having compatibility with a container material is sealed in a reduced pressure state. Working fluid, for example, may include water, CFC substitute, perfluorocarbon, cyclopentane or the like.

As described above, since in the heat sink 1, in the planar direction of the heat receiving plate 10, that is, an entire surface of the heat receiving plate 10, the first heat conductor 16 and the second heat conductor 18 is heat equalized, an end part of the heat dissipation fins 13 on the side of the heat receiving plate 10 is heat equalized as a whole. As a result heat dissipation efficiency of the heat dissipation fins 13 improved, accordingly cooling performance of the heat sink 11 is improved.

Now, a heat sink according to a second embodiment of the present disclosure will be described with reference to the drawings. The same constituent elements as those of the heat sink according to the first embodiment will be described using the same reference numerals.

Figure 2:
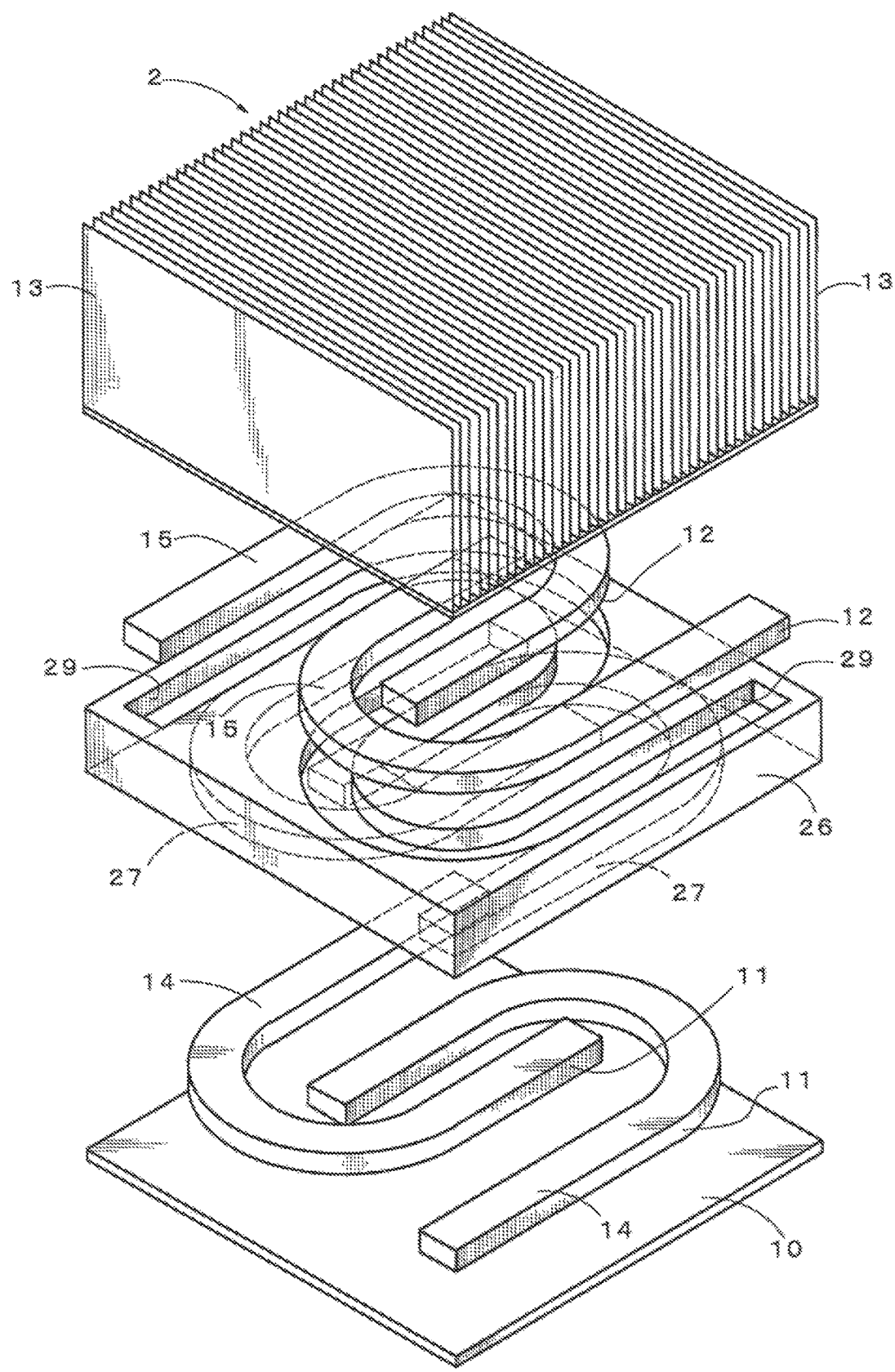
FIG. 2 is an exploded perspective view of a heat sink according to a second embodiment of the present disclosure.

As shown in FIG. 2, in a heat sink 2 according to the second embodiment, the first heat conductor and the second heat conductor of the heat sink according to the first embodiment are integrated into a composite heat conductor 26. The composite heat conductor 26 has a flat plate-like shape. On a surface of the composite heat conductor 26 on the side of the heat receiving plate 10, first groove parts 27 having a shape and dimensions corresponding to the shape and dimensions of the first heat pipe 11 in plan view are provided in the installation number of the first heat pipe 11. Further, on the surface of the composite heat conductor 26 on the side of the heat dissipation fins 13 (that is, on the side opposite to the site of the heat receiving plate 10), second groove parts 29 having a shape and dimensions corresponding to the shape and dimensions of the second heat pipe 12 in plan view are provided in the installation number of second heat pipes 12. Further, first groove parts 27 and second groove parts 29 are arranged so as not to coincide in plan view.

Therefore, in the heat sink 2, by fitting the first heat pipes 11 into the first groove parts 27 of the composite heat conductor 26 and fitting the second heat pipes 12 into the second groove parts 29 of the composite heat conductor 26, the second heat pipes 12 are laminated on the first heat pipes 11. As a result, the heat pipes in a plurality of layers (two layers in FIG. 2) are provided. Further, by fitting the first heat pipes 11 into the first groove parts 27 of the composite heat conductor 26 and fitting the second heat pipes 12 into the second groove parts 29 of the composite heat conductor 26, the first heat pipes 11 and the second heat pipes 12 are thermally connected via the composite heat conductor 26.

Also in the heat sink 2, since in the planar direction of the heat receiving plate 10, that is, an entire surface of the heat receiving plate 10 and the composite heat conductor 26 is heat equalized, an end part of the heat dissipation fins 13 on the side of the heat receiving plate 10 is heat equalized as a whole and cooling performance of the heat sink 2 is improved. In addition, in the heat sink 2 having the composite heat conductor 26, thermal resistance between the first heat pipes 11 and the second heat pipes 12 is further reduced, so that heat equaling of an entire plane of the heat receiving plate 10 is further improved.

Now, a heat sink according to a third embodiment of the present disclosure will be described with reference to the drawings. The same constituent elements as those of the heat sink according to the first embodiment will be described using the same reference numerals.

Figure 3:
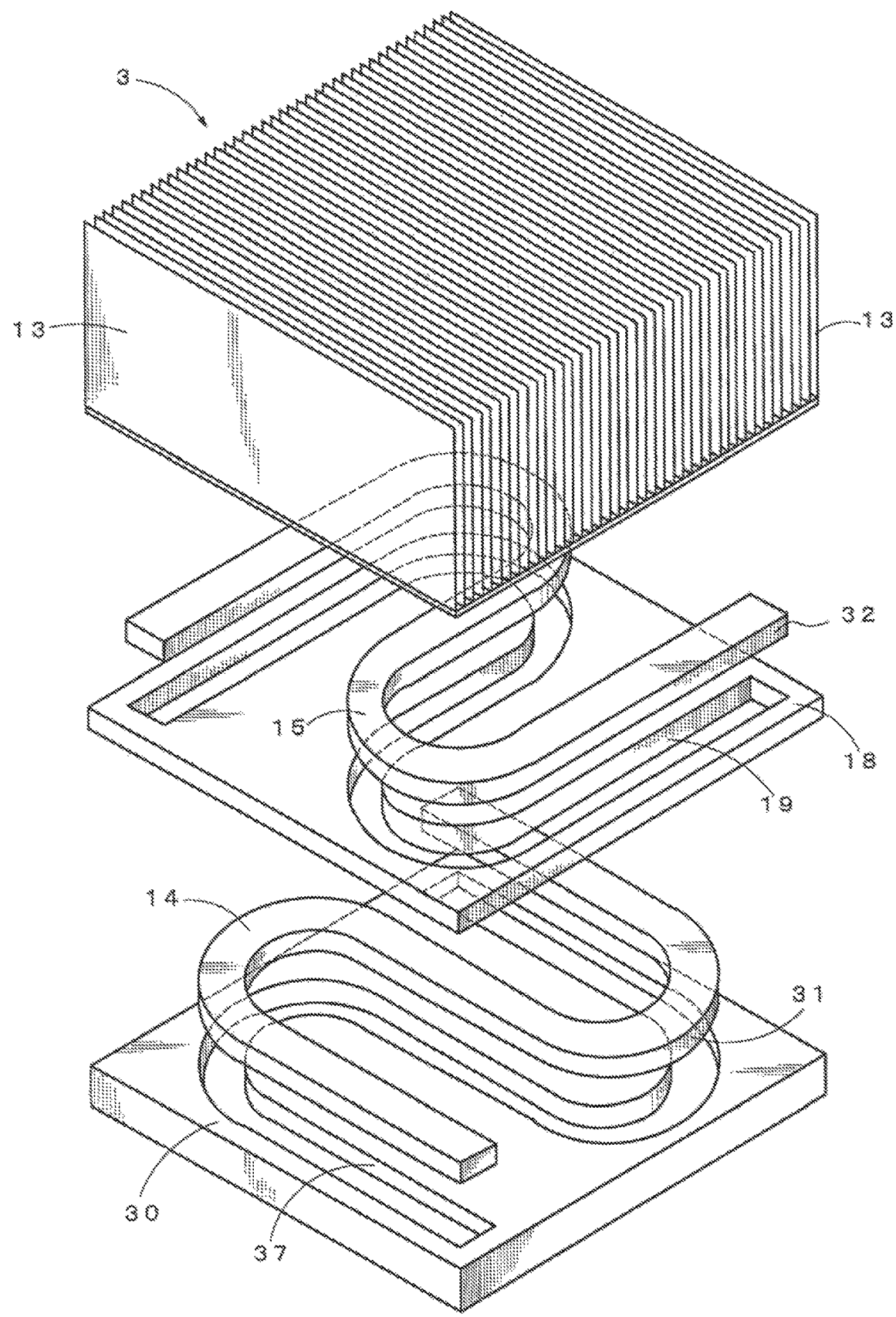
FIG. 3 is an exploded perspective view of a heat sink according to a third embodiment of the present disclosure.

As shown in FIG. 3, in a heat sink 3 according to the third embodiment, the first heat conductor and the heat receiving plate of the heat sink according to the first embodiment are integrated with each other to form a composite heat receiving plate 30. The composite heat receiving plate 30 has a flat plate-like shape. On a surface of the composite heat receiving plate 30 on the side of the heat dissipation fins 13, a third groove part 37 having a shape and dimensions corresponding to a shape and dimensions of a first heat pipe 31 in plan view is provided in the installation number of the first heat pipe 31. Further, a third groove part 37 of the composite heat receiving plate 30 and a hole part 19 of a second heat conductor 18 are arranged so as not to be coincident in plan view.

Therefore, in the heat sink 3, by fitting the first heat pipe 31 into the third groove part 37 of the composite heat receiving plate 30 and fitting a second heat pipe 32 into the hole part 19 of the second heat conductor 18, the second heat pipe 32 is laminated on the first heat pipe 31, and heat pipes in a plurality of layers (two layers in FIG. 3) are provided. Further, by fitting the first heat pipe 31 into the third groove part 37 of the composite heat receiving plate 30, the composite heat receiving plate 30 and the first heat pipe 31 are thermally connected.

In the heat sink 3, shapes of the first heat pipe 31 and the second heat pipe 32 in plan view are S-shaped. In addition, both the installation number of the first heat pipe 31 and the installation number of the second heat pipe 32 are single. Further, an arrangement of the second heat pipe 32 in plan view is in an aspect in which an arrangement of the first heat pipe 31 in plan view is related by a predetermined angle (90° in FIG. 3) around an orthogonal axis to a surface of the composite heat receiving plate 30 as a rotation axis.

Also in the heat sink 3, since a planar direction of the composite heat receiving plate 10, that is, an entire surface of the composite heat receiving plate 30 and the second heat conductor 18 is heat equalized, an end part of the heat dissipation fins 13 on a side of the composite heat receiving plate 30 is heat equalized as a whole and cooling performance of the heat sink 3 is improved.

Now, a heat sink according to a fourth embodiment of the present disclosure will be described with reference to the drawings. The same constituent elements as those of the heat sink according to the first embodiment will be described using the same reference numerals.

Figure 4:
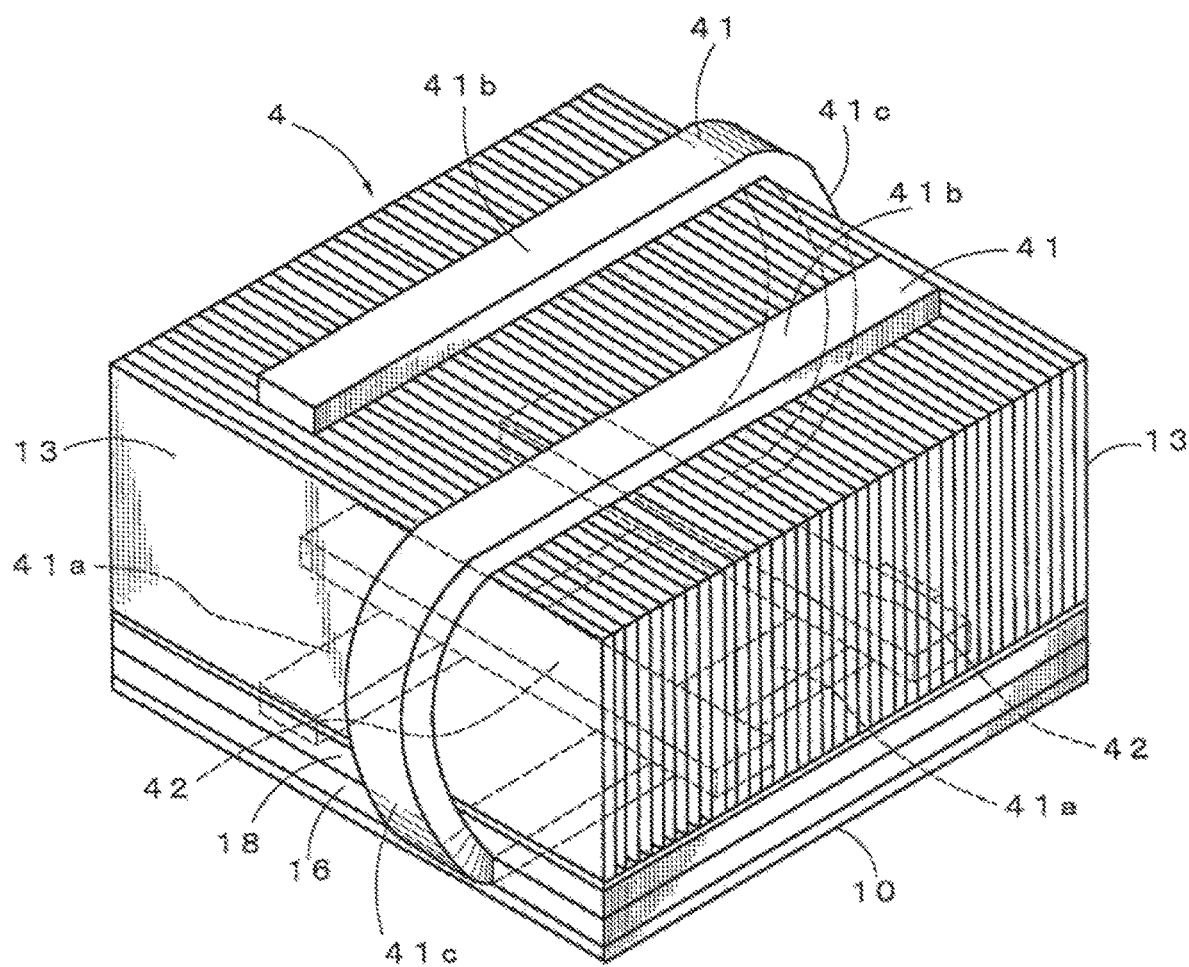
FIG. 4 is a perspective view of a heat sink according to a forth embodiment of the present disclosure.

As shown in FIG. 4, in a heat sink 4 according to the fourth embodiment in place of the U-shaped second heat pipe, a shape of a second heat pipe 42 is linear. Further, a shape of a first heat pipe 41 is U-shaped, the first heat pipe 41 has one straight part 41a and the other straight part 41b opposed to each other and a curved part 41c between one straight part 41a and the other straight part 41b. In the first heat pipe 41, one straight part 41a of the U-shaped portion is in contact with the surface of the heat receiving plate 10 on the side of the heat dissipation fins 13. Further, the first heat pipes 41 are erected vertically to the surface of the heat receiving plate 10. Therefore, a shape of the first heat pipe 41 is linear in plan view.

Furthermore, a position of one straight part 41a of the first heat pipe 41 is arranged so as not to be coincident with a position of the second heat pipe 42 in plan view. In the heat sink 4, it is in an aspect in which in plan view, one straight part 41a of the first heat pipe 41 and the linear second heat pipe 42 intersect each other. In FIG. 4, one straight part 41a and the second heat pipe 42 are arranged so aa to be orthogonal or approximately orthogonal to each other.

Even when the shapes of the first heat pipe 41 and the second heat pipe 42 are linear in plan view as the heat sink 4, an entire plane of the heat receiving plate 10, the first heat conductor 16 and the second heat conductor 18 is heat equalized, so that heat dissipation efficiency of the heat dissipation fins 13 is improved.

Further, in the heat sink 4, the other straight part 41b of the first heat pipe 41 is thermally connected to the top part of the heat dissipation fins 13. Therefore, an end part of the heat dissipation fins 13 on a side opposite to the heat receiving plate 10 is thermally connected to the heat receiving plate 10 via the first heat pipes 41.

In the heat sink 4, in the point that heat transferred from the heating element not shown to the heat receiving plate 10, is transferred not only from the heat receiving plate 10 to one straight part 41a of the first heat pipes 41, but also from the heat receiving plate 10 to the top part of the heat dissipation fins 13 by the first heat pipes 41, heat dissipation efficiency of the heat dissipation fins 13 is further improved.

Now, examples of a use method of the heat sink according to the present disclosure will be described. On the back side of the heat receiving plate of the heat sink of the present disclosure, a heating element such as electronic parts mounted on mobile bodies such as railroad vehicles, aircraft, automobiles or the like and electronic devices is thermally connected. From the viewpoint of efficiency to be cooled of the heating element, it is preferable to arrange the heating element such that at least a portion of a heat pipe (for example, the first heat pipe) is positioned at the same position as the heating element in plan view. Then, by natural air cooling or forced air cooling of the heat dissipation fins of the heat sink, heat derived from the heating element is dissipated from the heat dissipation fins to the external environment and the heating element is cooled.

Now, another embodiment of a heat sink of the present disclosure will be described. In each of the above described embodiments, heat pipes are provided in two layers in the vertical direction to the surface of the heat receiving plate, but the number of laminated heat pipes, as long as the number of laminated heat pipes is plural, is not limited to two, and may be three or more layers. Further, in the case in which the number of laminated heat pipes is three or more, positions of the heat pipes on the surface of the heat receiving plate, that is, the positions of the heat pipes in plan view may be arranged such that at least two layers of three or more layers are not identical to each other, and may be arranged so that each of the layers is not identical to each other, as necessary.

In the first and second embodiments described above, the shapes of the first heat pipe and the second heat pipe, that is, the shapes of the container of the first heat pipe and the second heat pipe are U-shaped, but a shape of a heat pipe is not particularly limited, and may be, for example, linear. L-shaped, channel-shaped, or the like. Further, in the first to third embodiments, the shape of the first heat pipe and the shape of the second heat pipe are the same, but the first heat pipe and the second heat pipe may have different shapes. Further, in the first, second, and fourth embodiments, each of the plurality of the first heat pipes has the same shape, but may have different shapes, and each of the plurality of second heat pipes has the same shape, but may have different shapes.

In the first and second embodiments described above, the arrangement of the second heat pipes of the second heat pipe layer in plan view is in an aspect in which the arrangement of the first heat pipes of the first heat pipe layer is reversed, but the arrangement relationship of the heat pipes of the first heat pipe layer and the second heat pipe layer in plan view may not be the same, for example, the arrangement of the second heat pipes of the second heat pipe layer in plan view may be in an aspect in which the arrangement of the first heat pipes of the first heat pipe layer in plan view is related by a predetermined angle (for example 90° to 180°) about an orthogonal axis to the surface of the heat receiving plate as a rotation axis. Further, in the third embodiment described above, the arrangement of the second heat pipe in plan view is in an aspect in which the arrangement of the first heat pipe in plan view is rotated by 90° about an orthogonal axis to the surface of the composite heat receiving plate as a rotation axis, but as described above, the arrangement relationship of the first heat pipe and the second heat pipe in plan view may not be the same, for example, the arrangement of the second heat pipe inn plan view may be in an aspect in which the arrangement of the first heat pipe is reversed.

EXAMPLE

Next, examples of the present disclosure will be described. However, the present disclosure is not limited to these examples unless the invention departs from the spirit thereof.

Figure 5:
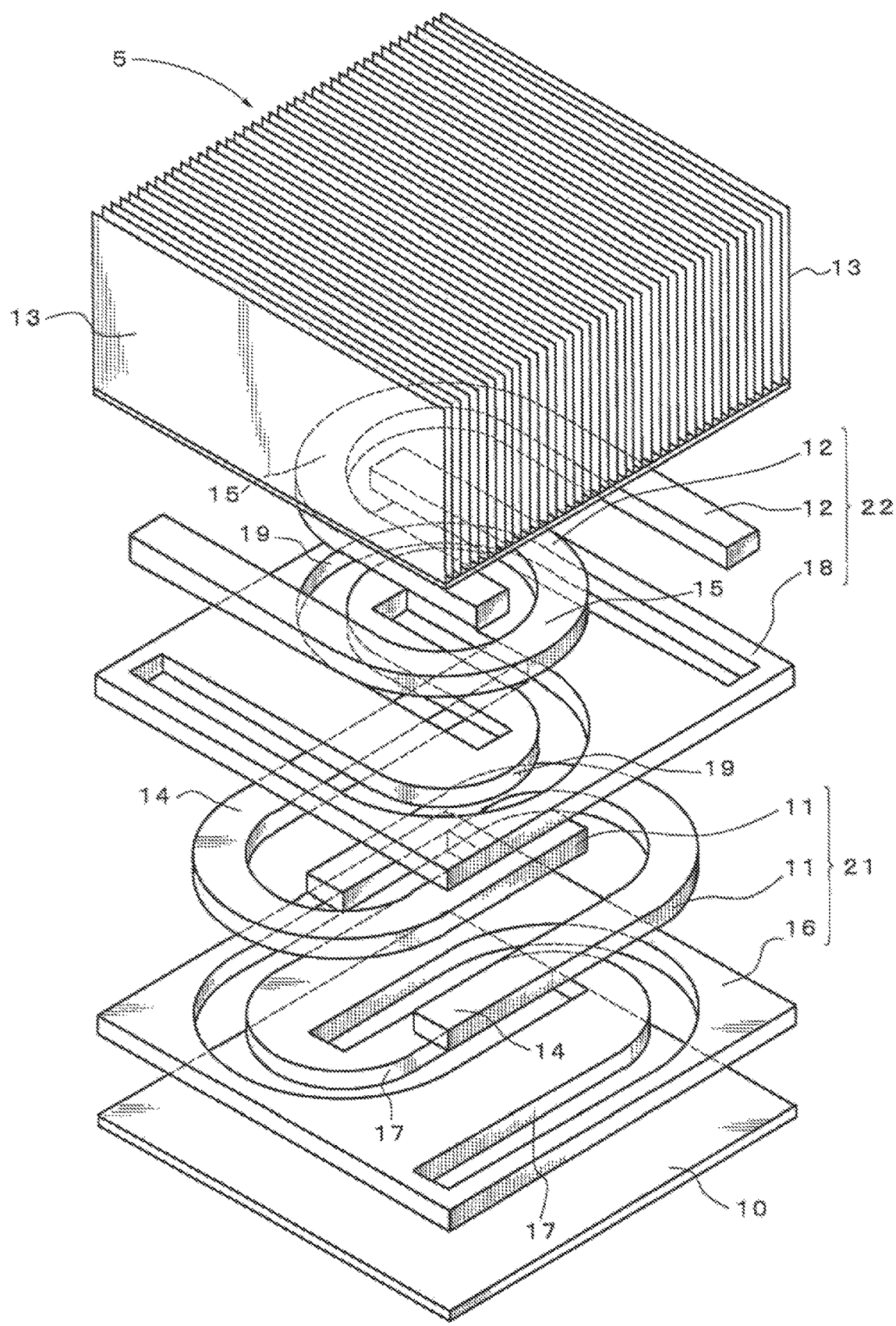
FIG. 5 is an exploded perspective view of a heat sink of the present disclosure used in an example.

In the heat sink 1 according to the first embodiment, the arrangement of the second heat pipe 12 of the second heat pipe layer 22 in plan view was in an aspect in which the arrangement of the first heat pipe 11 of the first heat pipe layer 21 is reversed. Instead of this, as Example 1, as shown in FIG. 5, a heat sink 5 was used in an aspect in which an arrangement of the second heat pipes 12 of the second heat pipe layer 22 in plan view was such that the arrangement or the first heat pipes 11 of the first heat pipe layer 21 in plan view was rotated by 90° about the orthogonal axis to the surface of the heat receiving plate as the rotation axis.

Figure 6:
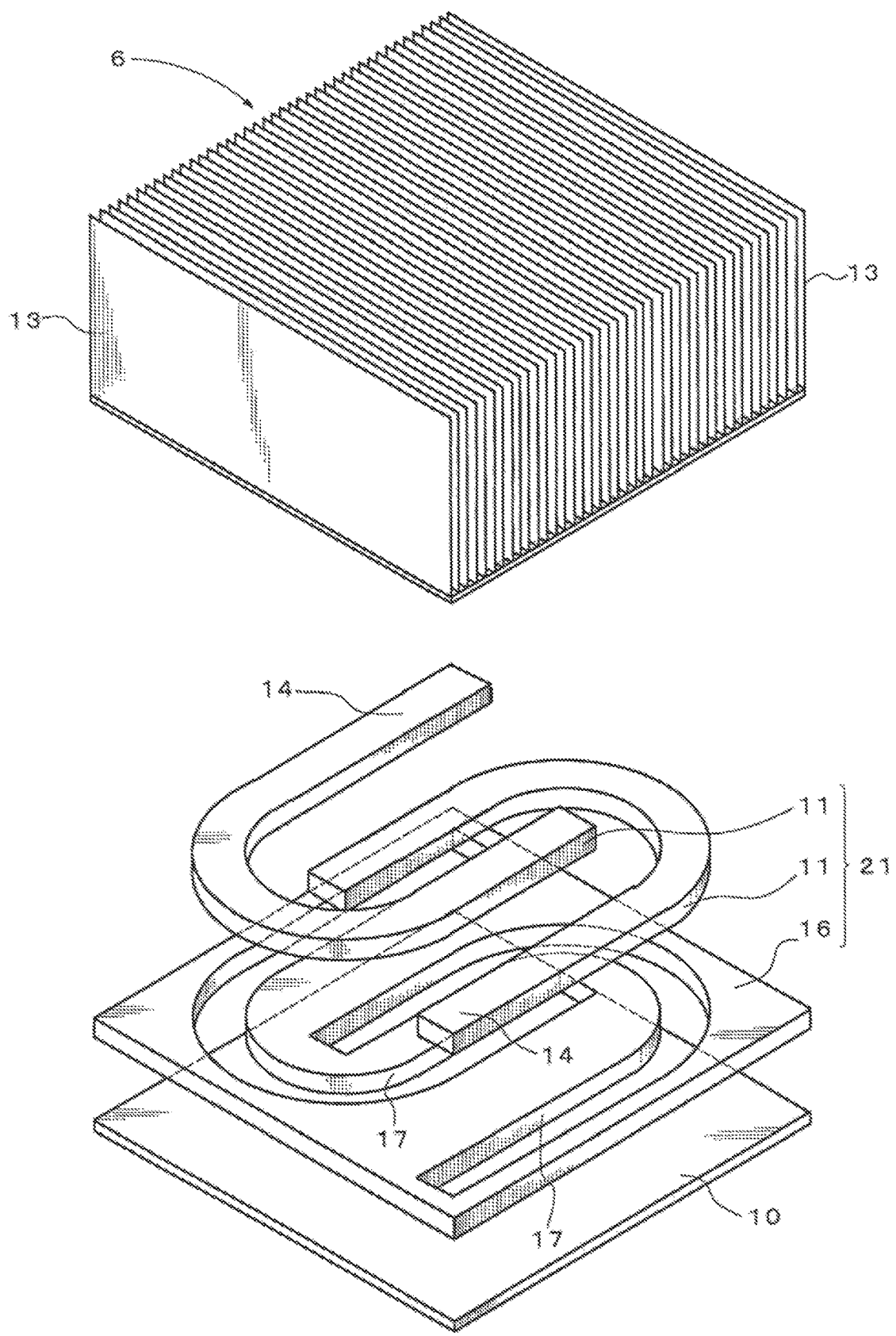
FIG. 6 is an exploded perspective view of a heat sink used in a comparative example.

As a comparative example 1, as shown in FIG. 6, of the heat sink 1 according to the first embodiment, a heat sink 6 not provided with a second heat pipe layer 22, that is, the heat sink 6 provided with only a first heat pipe layer 21 was used.

The specifications of the heat sink 5 of Example 1 and the heat sink 6 of Comparative Example 1 are as follows.

About Heat Sink 5 and 6

Dimensions: length (dimension parallel to the plane of the heat dissipation fin 13) 120 mm×width (dimension in the arrangement direction of the heat dissipation fins 13) 82 mm×height (dimension from the surface of the heat receiving plate 10 of the heat receiving side to the top part of the heat dissipation fin 13) 26 mm.

About Heat Dissipation Fin 13

About Air (Cooling Wind) Volume 5, 10, 13, 15, 18, 20, 25 CFM.

About Heating Element

Heat input: 165 W.

Heat conductive grease ("X-23-7783 D" manufactured by Shin-Etsu Chemical Co., Ltd.) is applied at a thickness of 0.1 mm between the heating element and the heat receiving plate 10.

About Test Equipment

Wind tunnel.

The test results of Example 1 and Comparative Example 1 are shown in Table 1 below.

TABLE 1

| | COMPARATIVE EXAMPLE 1 | | | | | | |
|---|---|---|---|---|---|---|---|
| AIR VOLUME (CFM) | 5 | 10 | 13 | 15 | 18 | 20 | 25 |
| PRESSURE LOSS (Pa) | 26.15 | 55.02 | 75.60 | 92.75 | 117.80 | 136.19 | 187.81 |
| HEAT INPUT (W) | 165.5 | 165.6 | 165.6 | 165.5 | 165.5 | 165.5 | 165.5 |
| HEATING ELEMENT TEMPERATURE (deg C.) | 104.3 | 73.8 | 67.7 | 64.6 | 62 | 60.7 | 58 |
| INFLOW AIR TEMPERATURE (deg C.) | 28.9 | 28.8 | 29.2 | 29.1 | 29.2 | 29.3 | 29.4 |
| THERMAL RESISTANCE Rca = (HEATING ELEMENT TEMPERATURE-INFLOW AIR TEMPERATURE/Power) ≈ (deg C./W) | 0.456 | 0.272 | 0.233 | 0.214 | 0.198 | 0.190 | 0.173 |

| | EXAMPLE 1 | | | | | | |
|---|---|---|---|---|---|---|---|
| AIR VOLUME (CFM) | 5 | 10 | 13 | 15 | 18 | 20 | 25 |
| PRESSURE LOSS (Pa) | 26.29 | 55.44 | 75.87 | 93.25 | 118.64 | 136.62 | 188.02 |
| HEAT INPUT (W) | 165.5 | 165.5 | 165.5 | 165.5 | 165.5 | 165.5 | 165.5 |
| HEATING ELEMENT TEMPERATURE (deg C.) | 103.7 | 74.7 | 68.5 | 65 | 62.3 | 60.9 | 58.4 |
| INFLOW AIR TEMPERATURE (deg C.) | 30.8 | 31.1 | 31.3 | 30.6 | 30.8 | 30.8 | 30.9 |
| THERMAL RESISTANCE Rca = (HEATING ELEMENT TEMPERATURE-INFLOW AIR TEMPERATURE/Power) ≈ (deg C./W) | 0.440 | 0.263 | 0.225 | 0.208 | 0.190 | 0.182 | 0.166 |

Dimensions of heat dissipation fin 13: thickness 0.3 mm×height 21.5 mm.

Fin pitch: 1.73 mm.

Installation number: 47.

Material: Aluminum.

About Heat Receiving Plate 10

Thickness: 0.5 mm for the heat sink 5 of Example 1. 1.5 mm for the heat sink 6 of Comparative Example 1.

About Heat Pipe Layer

Heat sink 5 of Example 1: Each of the first heat pipe 11 and the second heat pipe 12 has a thickness of 2.0 mm and a container of a diameter of 6 mm is processed into a flat shape. Each of the first heat conductor 16 and the second heat conductor 18 has a thickness of 2.0 mm. Both of the first heat conductor 16 and the second heat conductor 18 are made of aluminum.

Heat sink 6 of Comparative Example 1: The thickness of the first heat pipe 11 is 3.0 mm, and a container of a diameter of 6 mm is processed into a flat shape. The thickness of the first heat conductor 16 is 3.0 mm. The material of the first heat conductor 16 is aluminum.

The measurement conditions of the heat transport characteristics of the heat sink 5 of Example 1 and the heat sink 6 of Comparative Example 1 are as follows.

From the above Table 1, the thermal resistance of Example 1 was reduced by 0.016 deg C/W at 5 CFM, 0.009 deg C/W at 10 CFM, 0.008 deg C/W at 13 CFM, 0.006 deg C/W at 15 CFM, 0.008 deg C/W at 18 CFM, 0.008 deg C/W at 20 CFM, 0.007 deg C/W at 23 CFM, with respect to the thermal resistance of Comparative Example 1, respectively. Also, since the heat input from the heating element is 165 W, from the above Table 1, the thermal resistance of Example 1 was reduced by 2.5 deg C at 5 CFM, 1.4 deg C at 10 CFM, 1.3 deg C at 13 CFM, 1.1 deg C at 15 CFM, 1.3 deg C at 18 CFM, 1.3 deg C at 20 CFM, 1.1 deg C at 25 CFM, with respect to the thermal resistance of Comparative Example 1, respectively.

Accordingly, in the heat sink 5 of Example 1, in which the first heat pipe layer 21 and the second heat pipe layer 22 are laminated and arranged such that the first heat pipes 11 and the second heat pipes 12 do not coincide in plan view, thermal resistance could be reduced at any air volume of 5 to 25 CFM, as compared with the heat sink 6 of Comparative Example 1 in which the second heat pipe layer 22 was not provided.

INDUSTRIAL APPLICABILITY

Since the heat sink of the present disclosure exhibits excellent cooling characteristics by heat equalizing the whole in the planar direction of the heat receiving plate in the heat sink and improving heat dissipation efficiency of the heat dissipation fins, it can be used in a wide range of fields and has high utility value, for example, in the field in which electronic components mounted on moving bodies such as railroad vehicles, aircrafts, automobiles or the like and electronic devices is cooled.

LIST OF REFERENCE SIGNS 1, 2, 3, 4, a heat sink
10 heat receiving plate
11, 41 first heat pipe
12, 42 second heat pipe
13 heat dissipation fin
16 first heat conductor
18 second heat conductor
26 composite heat conductor
30 composite heat receiving plate

The invention claimed is:

1. A heat sink comprising:
a heat receiving plate configured for thermal connection thermally connected to a heating element;
heat pipes formed from a tube body thermally connected to the heat receiving plate; and
heat dissipation fins thermally connected to the heat receiving plate,
wherein the heat pipes are provided in a plurality of layers in a vertical direction to a surface of the heat receiving plate by having a first heat pipe layer and a second heat pipe layer laminated on the first heat pipe layer in a vertical direction to the surface of the heat receiving plate, wherein the first heat pipe layer is formed by a first heat pipe and a first heat conductor provided around the first heat pipe being thermally connected thereto, wherein the first heat pipe is fitted into a groove part of the first heat conductor, wherein the groove part has a shape and dimensions corresponding to a shape and dimensions of the first heat pipe, and wherein the second heat pipe layer is formed by a second heat pipe and a second heat conductor provided around the second heat pipe being thermally connected thereto, wherein the second heat pipe is fitted in a hole part of the second heat conductor, wherein the hole part has a shape and dimensions correspond to a shape and dimensions of the second heat pipe and in at least two layers of the plurality of layers, positions of the heat pipes on the surface of the heat receiving plate are not identical to each other, and wherein at least a portion of the first heat pipe is in contact with the second heat pipe layer, wherein the heat receiving plate and the heat dissipation fins overlap a whole of the first heat pipe layer and a whole of the second heat pipe layer in plan view, and the whole of the first heat pipe layer overlaps the whole of the second heat pipe layer in plan view,
wherein the second heat conductor is a plate-like body, and the surface thereof is arranged in the parallel direction to a whole of the surface of the heat receiving plate, and
wherein the heat dissipation fins, which are different from the second heat conductor, are erected such that the heat dissipation fins are vertical to a surface of the second heat pipe layer in a state in which the heat dissipation fins contact the second heat pipes and the second heat conductor in the second heat pipe layer via the plate-like body.

2. The heat sink according to claim 1, wherein the heat pipes have a flat shape.

3. The heat sink according to claim 1, wherein a shape of the heat pipes is U-shaped, linear, L-shaped, S-shaped, or channel-shaped.

4. The heat sink according to claim 1, wherein at least a portion of the heat pipes is arranged at a same position as the heating element in plan view.

\* \* \* \* \*